US011547008B2

(12) United States Patent
Lee et al.

(10) Patent No.: US 11,547,008 B2
(45) Date of Patent: Jan. 3, 2023

(54) ELECTRONIC DEVICE INCLUDING MAGNETIC STRUCTURE

(71) Applicant: Samsung Electronics Co., Ltd., Suwon-si (KR)

(72) Inventors: Gihoon Lee, Suwon-si (KR); Jaedeok Lim, Suwon-si (KR); Gyuyeong Cho, Suwon-si (KR); Joon Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 59 days.

(21) Appl. No.: 17/247,960

(22) Filed: Dec. 31, 2020

(65) Prior Publication Data

US 2021/0212226 A1 Jul. 8, 2021

(30) Foreign Application Priority Data

Jan. 2, 2020 (KR) ........................ 10-2020-0000499

(51) Int. Cl.
*H05K 7/02* (2006.01)
*H05K 7/04* (2006.01)
(Continued)

(52) U.S. Cl.
CPC ............. *H05K 5/0226* (2013.01); *H01F 7/02* (2013.01); *H05K 5/0017* (2013.01)

(58) Field of Classification Search
CPC combination set(s) only.
See application file for complete search history.

(56) References Cited

U.S. PATENT DOCUMENTS

2007/0133156 A1* 6/2007 Ligtenberg ............ G06F 1/1616
361/679.3
2010/0238620 A1 9/2010 Fish
(Continued)

FOREIGN PATENT DOCUMENTS

JP 2010-282143 A 12/2010
KR 10-2019-0025264 A 3/2019
(Continued)

OTHER PUBLICATIONS

International Search Report dated Apr. 15, 2021 in connection with International Patent Application No. PCT/KR2020/019394, 4 pages.
(Continued)

*Primary Examiner* — Hung S. Bui

(57) ABSTRACT

An electronic device according to various embodiments may include: a display; a rear plate disposed in a direction opposite to the display; a side member surrounding a space between the display and the rear plate and including a support member configured to support the display; and at least one magnetic structure included in at least a portion of the side member. Where the at least one magnetic structure includes a magnetic force generating source and a magnetic force output guide connected to the magnetic force generating source, and at least a portion of the magnetic force output guide extends in a direction of the display. Where at least a portion of the magnetic force output guide includes a structure formed in a direction of an upper surface of the side member.

18 Claims, 11 Drawing Sheets

(51) Int. Cl.
    *H05K 5/02*     (2006.01)
    *H01F 7/02*     (2006.01)
    *H05K 5/00*     (2006.01)

(56) References Cited

U.S. PATENT DOCUMENTS

| | | | |
|---|---|---|---|
| 2013/0010405 A1 | 1/2013 | Rothkopf et al. | |
| 2015/0241925 A1 | 8/2015 | Seo et al. | |
| 2017/0332494 A1 | 11/2017 | Park | |
| 2018/0364761 A1 | 12/2018 | Lin et al. | |
| 2018/0366813 A1 | 12/2018 | Kim et al. | |
| 2020/0267861 A1 | 8/2020 | Kim | |
| 2020/0293093 A1* | 9/2020 | Kim | G06F 1/1677 |
| 2021/0034102 A1* | 2/2021 | Cho | H01F 7/0226 |

FOREIGN PATENT DOCUMENTS

| | | |
|---|---|---|
| KR | 10-2094873 B1 | 3/2020 |
| KR | 10-2020-0101791 A | 8/2020 |
| KR | 10-2021-0015468 A | 2/2021 |

OTHER PUBLICATIONS

Written Opinion of the International Searching Authority dated Apr. 15, 2021 in connection with International Patent Application No. PCT/KR2020/019394, 3 pages.

* cited by examiner (501)

(502)

ELECTRONIC DEVICE INCLUDING MAGNETIC STRUCTURE

CROSS-REFERENCE TO RELATED APPLICATION

This application is based on and claims priority under 35 U.S.C. 119 to Korean Patent Application No. 10-2020-0000499 filed on Jan. 2, 2020 in the Korean Intellectual Property Office, the disclosure of which is herein incorporated by reference in its entirety.

BACKGROUND

1. Field

Various embodiments relate to an electronic device including a magnetic structure.

2. Description of Related Art

A display may be included in not only a large electronic device but also a small and portable electronic device. Recently, an electronic device has evolved into various structures in order to expand a display or improve the utilization of the display. For example, a foldable electronic device having housings foldable on each other has been proposed, and various improvement measures have been prepared for a folding structure.

The above information is presented as background information only to assist with an understanding of the disclosure. No determination has been made, and no assertion is made, as to whether any of the above might be applicable as prior art with regard to the disclosure.

SUMMARY

In order to fold at least two housings or implement a foldable electronic device through a flexible display, a separate configuration for maintaining a folding state by a predetermined force or more may be required. For example, a flexible electronic device may implement a folding structure based on a magnetic body.

In order to maintain the folding of an electronic device by a magnetic force of a magnetic body, a magnetic body having a predetermined size or more is required to secure a magnetic force. However, since the magnetic force affects components of an electronic device, there may be restriction on a mounting space for a magnetic body or an electronic component.

According to various embodiments, a guide structure which can secure the strength of a magnetic force while reducing a mounting space for a magnetic body may be provided, so that an electronic device capable of securing folding performance may be provided.

An electronic device according to various embodiments may include: a display; a rear plate disposed in a direction opposite to the display; a side member surrounding a space between the display and the rear plate and including a support member configured to support the display; and at least one magnetic structure included in at least a portion of the side member, wherein: the at least one magnetic structure includes a magnetic force generating source and a magnetic force output guide connected to the magnetic force generating source, and at least a portion of the magnetic force output guide extends in a direction of the display; and at least a portion of the magnetic force output guide includes a structure formed in a direction of an upper surface of the side member.

An electronic device according to various embodiments may include: a first housing including a first surface, a second surface facing in a direction opposite to the first surface, and a first side member disposed between the first surface and the second surface; a second housing including a third surface facing the same direction as the first surface, a fourth surface facing the same direction as the second surface, and a second side member disposed between the third surface and the fourth surface; a display disposed in at least a portion of each of the first surface and the third surface; at least one first magnetic structure included in at least a portion of the first side member; and at least one second magnetic structure included in at least a portion of the second side member and disposed to be symmetrical to the at least one first magnetic structure at a position opposite to the at least one first magnetic structure in a state in which the first housing and the second housing are folded, wherein: the at least one first magnetic structure includes a first magnetic force generating source disposed in a direction of the second surface and a first magnetic force output guide disposed in a direction of the first surface; at least a portion of the first magnetic force output guide includes a structure formed in the direction of the first surface; the at least one second magnetic structure includes a second magnetic force generating source disposed in a direction of the fourth surface and a second magnetic force output guide disposed in a direction of the third surface; and at least a portion of the second magnetic force output guide includes a structure formed in the direction of the third surface.

According to various embodiments, even when the size of a magnet is reduced, a guide structure allows expansion of the magnetic field area only in an upper end portion of the magnet and thus ensures the size of an attractive force. Further, the reduced size of the magnet decreases the magnetic field area in a lower end portion of the magnet, so as to minimize the magnetic field interference on an electronic component mounted on an electronic device. Accordingly, a separate shielding structure for magnetic field shielding may be unnecessary in the electronic device. In addition, according to various embodiments, by the reduction of the size of the magnet, a mounting space in which other electronic device configurations can be mounted can be secured in the electronic device.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
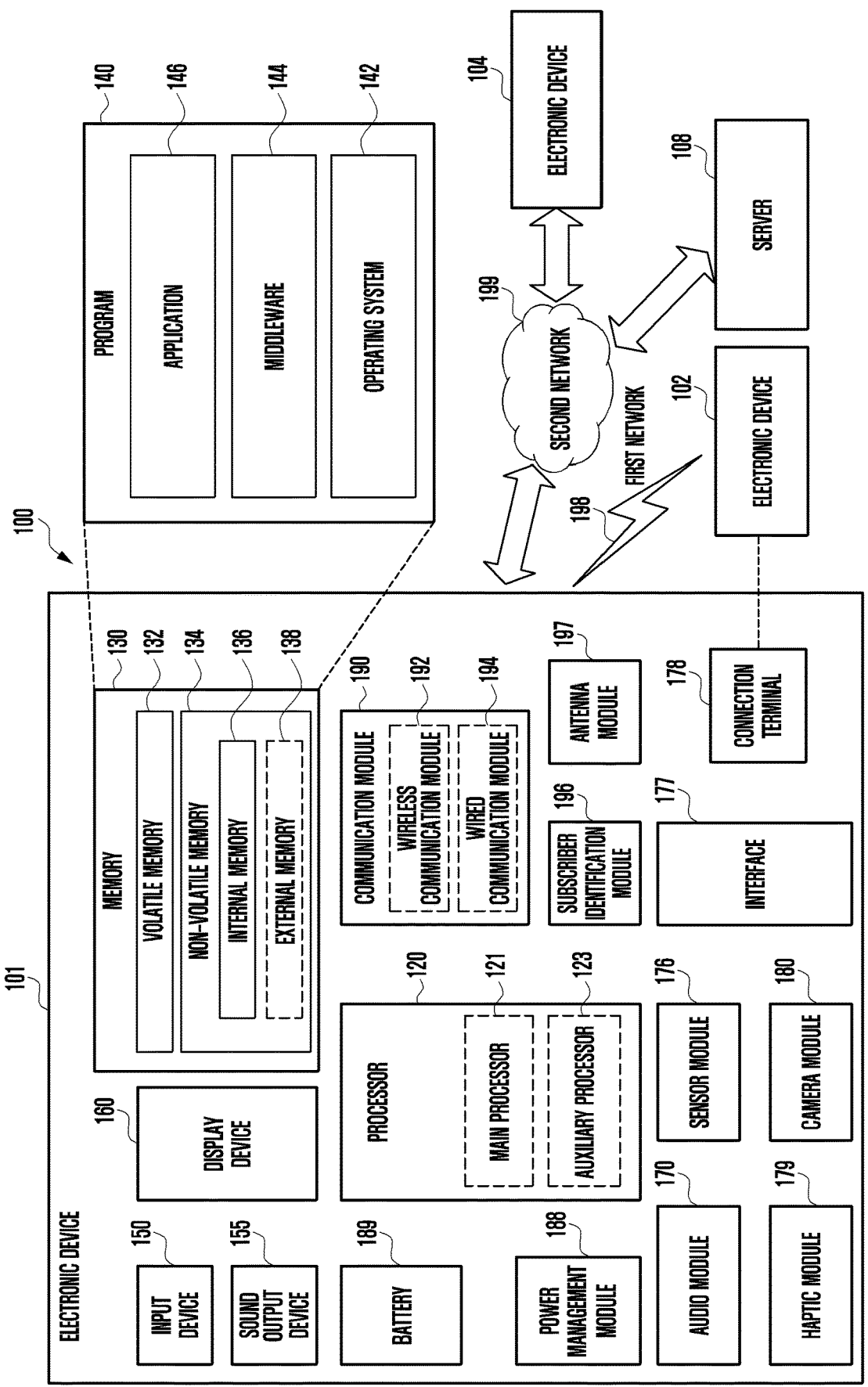
FIG. 1 is a block diagram illustrating an electronic device in a network environment according to various embodiments.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101.

According to an embodiment, the antenna module 197 may include an antenna including a radiating element composed of a conductive material or a conductive pattern formed in or on a substrate (e.g., PCB).

According to an embodiment, the antenna module 197 may include a plurality of antennas.

In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
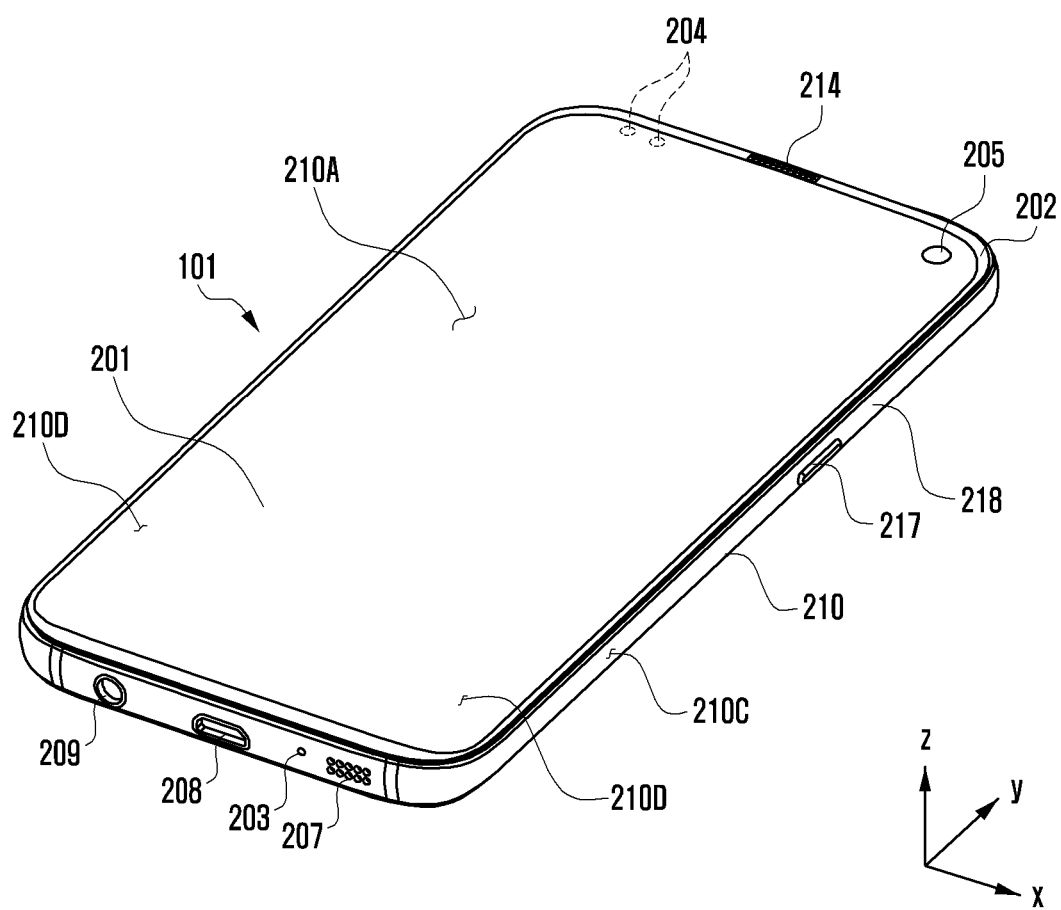
FIG. 2A illustrates a perspective view showing a front surface of a mobile electronic device according to an embodiment.
Figure 2B:
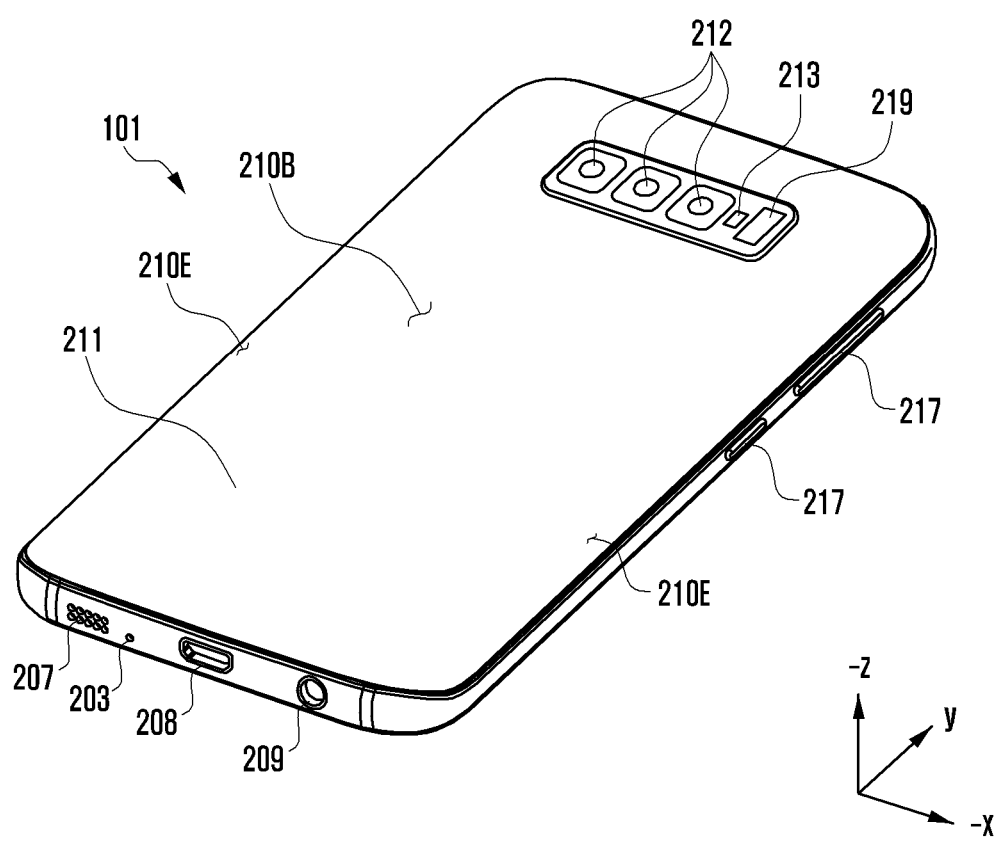
FIG. 2B illustrates a perspective view showing a rear surface of the mobile electronic device 101 shown in FIG. 2A.

FIG. 2A illustrates a perspective view showing a front surface of a mobile electronic device 101 according to an embodiment, and FIG. 2B illustrates a perspective view showing a rear surface of the mobile electronic device 101 shown in FIG. 2A.

Referring to FIGS. 2A and 2B, the mobile electronic device 101 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 101, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 101 may include at least one of a display 201, audio modules 203, 207 and 214, sensor modules 204 and 219, camera modules 205, 212 and 213, a key input device 217, a light emitting device, and connector holes 208 and 209. The mobile electronic device 101 may omit at least one (e.g., the key input device 217 or the light emitting device) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. Outlines (i.e., edges and corners) of the display 201 may have substantially the same form as those of the front plate 202. The spacing between the outline of the display 201 and the outline of the front plate 202 may be substantially unchanged in order to enlarge the exposed area of the display 201.

A recess or opening may be formed in a portion of a display area of the display 201 to accommodate at least one of the audio module 214, the sensor module 204, the camera module 205, and the light emitting device. At least one of the audio module 214, the sensor module 204, the camera module 205, the fingerprint sensor (not shown), and the light emitting element may be disposed on the back of the display area of the display 201. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

The audio modules 203, 207 and 214 may correspond to a microphone hole 203 and speaker holes 207 and 214, respectively. The microphone hole 203 may contain a microphone disposed therein for acquiring external sounds and, in a case, contain a plurality of microphones to sense a sound direction. The speaker holes 207 and 214 may be classified into an external speaker hole 207 and a call receiver hole 214. The microphone hole 203 and the speaker holes 207 and 214 may be implemented as a single hole, or a speaker (e.g., a piezo speaker) may be provided without the speaker holes 207 and 214.

The sensor modules 204 and 219 may generate electrical signals or data corresponding to an internal operating state of the mobile electronic device 101 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 101 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212 and 213 may include a first camera device 205 disposed on the first surface 210A of the electronic device 101, and a second camera device 212 and/or a flash 213 disposed on the second surface 210B. The camera module 205 or the camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the electronic device 101.

The key input device 217 may be disposed on the lateral surface 210C of the housing 210. The mobile electronic device 101 may not include some or all of the key input device 217 described above, and the key input device 217 which is not included may be implemented in another form such as a soft key on the display 201. The key input device 217 may include the sensor module disposed on the second surface 210B of the housing 210.

The light emitting device may be disposed on the first surface 210A of the housing 210. For example, the light emitting device may provide status information of the electronic device 101 in an optical form. The light emitting device may provide a light source associated with the operation of the camera module 205. The light emitting device may include, for example, a light emitting diode (LED), an IR LED, or a xenon lamp.

The connector holes 208 and 209 may include a first connector hole 208 adapted for a connector (e.g., a USB connector) for transmitting and receiving power and/or data to and from an external electronic device, and/or a second connector hole 209 adapted for a connector (e.g., an earphone jack) for transmitting and receiving an audio signal to and from an external electronic device.

Some sensor modules 205 of camera modules 205 and 212, some sensor modules 204 of sensor modules 204 and 219, or an indicator may be arranged to be exposed through a display 201. For example, the camera module 205, the sensor module 204, or the indicator may be arranged in the internal space of an electronic device 101 so as to be brought into contact with an external environment through an opening of the display 201, which is perforated up to a front plate 202. In another embodiment, some sensor modules 204 may be arranged to perform their functions without being visually exposed through the front plate 202 in the internal space of the electronic device. For example, in this case, an area of the display 201 facing the sensor module may not require a perforated opening.

According to various embodiments, a portion of the side member 218 and/or the front plate 202 or a combination thereof may further include a magnetic structure which induces an attractive force with an external magnetic body and at least partially increases the magnitude of a magnetic force (magnetism).

Figure 3A:
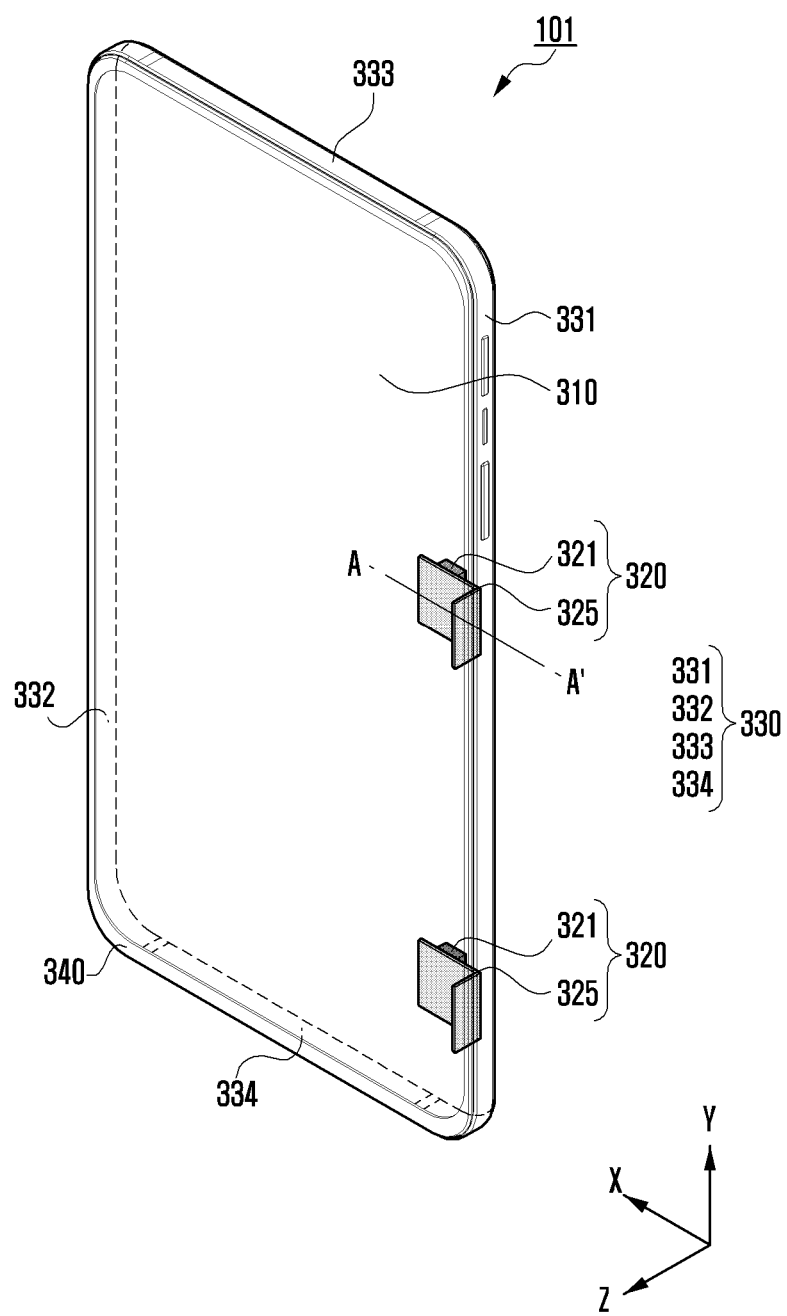
FIG. 3A illustrates a perspective view of an electronic device including a magnetic structure according to an embodiment.

FIG. 3A is a perspective view of an electronic device including a magnetic structure according to an embodiment.

Referring to FIG. 3A, a housing (e.g., the housing 210 of FIG. 2) of an electronic device (e.g., the electronic device 101 of FIG. 1) according to an embodiment may include at least one magnetic structure 320. According to an embodiment, the electronic device 101 may include at least a portion or the entire of the configuration of FIG. 1, but it will be omitted in FIG. 3A for convenience of description.

According to an embodiment, the magnetic structure 320 may form a magnetic field (a space or an area affected by a magnetic force, a magnetic field, and a magnetic action) in a horizontal area parallel to a display 310 disposed on the front surface at the edge of the display 310 (e.g., the display 201 of FIG. 2), for example, at a position of a side member 330 (e.g., the side member 218 of FIG. 2).

According to an embodiment, the magnetic structure 320 may be at least partially included in the side member 330. For example, the side member 330 may include a first surface part 331, a second side part 332, a third surface part 333, or a fourth side part 334, as shown in FIG. 3A. The first surface part 331 and the second side part 332 may be disposed on the opposite sides, and the third surface part 333 and the fourth side part 334 may be disposed on the opposite sides. The third surface part 333 may be perpendicular to the first surface part 331 (or the second side part 332) and may connect one end of the first surface part 331 and one end of the second side part 332. The fourth side part 334 may be perpendicular to the first surface part 331 (or the second side part 332) and may connect the other end of the first surface part 331 and the other end of the second side part 332. The distance between the first surface part 331 and the second side part 332 may be smaller than the distance between the third surface part 333 and the fourth side part 334.

As an example, FIG. 3A illustrates two magnetic structures 320 adjacent to the first surface part 331 and spaced apart from each other by a predetermined interval, but the disclosure is not limited thereto. According to various embodiments, in the electronic device 101, various numbers of magnetic structures 320 may be disposed adjacent to the first surface part 311, the second side part 332, the third surface part 333, or the fourth side part 334.

According to another embodiment, in the case of a foldable device, a magnetic structure may be disposed adjacent to the first surface part 331 in a first housing, and a magnetic structure may be disposed adjacent to the second side part 332 in a second housing. According to another embodiment, the magnetic structure 320 may be disposed in the form of a single line having a predetermined length.

The size and arrangement position of the magnetic structure 320 may be changed according to an arrangement position of an element (or electronic component) mounted inside the housing or a designer's intention. As an example, the magnetic structure 320 may be disposed to be spaced apart from an electronic component (e.g., a camera, a speaker, a magnetic sensor, or an acceleration sensor) including a magnetic body mounted in an inner space of the electronic device 101 by a predetermined distance. The magnetic structure 320 may be disposed in the inner space of the electronic device 101 without limiting a separation distance from electronic components (e.g., a display and a battery) other than the electronic component including the magnetic body.

According to an embodiment, the magnetic structure 320 may include a magnetic force generating source 321 and a magnetic force output guide 325. The magnetic force generating source 321 may include a magnet or a magnetic body including an N-pole and an S-pole. The magnetic force emitted from the N-pole of the magnetic force generating source 321 may converge on the S-pole to form a magnetic field having a predetermined size. One pole of the magnetic force generating source 321 may be disposed in a direction of an outer wall of the side member 330 and the other pole thereof may be disposed in a direction of an inner wall of the side member 330 so as to form a magnetic field in a horizontal area to be parallel to the display 310. The size of the magnetic force generating source 321 may be adjusted according to the length of the magnetic force output guide 325.

The magnetic force output guide 325 may help to increase an attractive force with an external magnetic body (e.g., a cover of an electronic device including a magnetic body or other electronic devices including a magnetic structure) by extending a range of a magnetic field generated from the magnetic force generating source 321. The magnetic force output guide 325 may include at least one of a material which can be magnetized by the magnetic force generating source 321, for example, pure iron, a steel use stainless (SUS) 430 material, a stainless steel (STS) material, and a steel plate cold commercial (SPCC) material.

According to an embodiment, the magnetic force output guide 325 may be coupled to or connected to one surface of the magnetic force generating source 321 in a direction in which an electronic component (e.g., a display) which does not affect a magnetic force is disposed. Since the magnetic force output guide 325 induces an increase in the attractive force, the magnetic force generating source 321 having a size smaller than that of the magnetic force generating source 321 used to implement a preconfigured magnetic force may be disposed in the electronic device 101.

According to an embodiment, the magnetic force generating source 321 and the magnetic force output guide 325 may be coupled through at least one of bonding, taping, and structural coupling. As an example, the magnetic force generating source 321 and the magnetic force output guide 325 may be coupled in a coupling manner using heat, but a manner using heat higher than a configured temperature may not be desirable.

According to an embodiment, the electronic device 101 may include a protection frame 340 (e.g., a decorative member or a decor) which protects the edge of the display 310. The protection frame 340 may extend from the side member 330 to be integrally formed therewith, or may be structurally coupled to the side member 330.

According to an embodiment, in the case where the protection frame 340 is structurally coupled to the side member in the electronic device 101, the magnetic structure 320 may be fixed (or attached) to at least a portion of each of the protection frame 340 and the side member 330. For example, in the embodiment of FIG. 4, the side member and the protection frame are shown in a structurally coupled state, but the side member may be integrally formed up to a structure range of the protection frame.

Figure 3B:
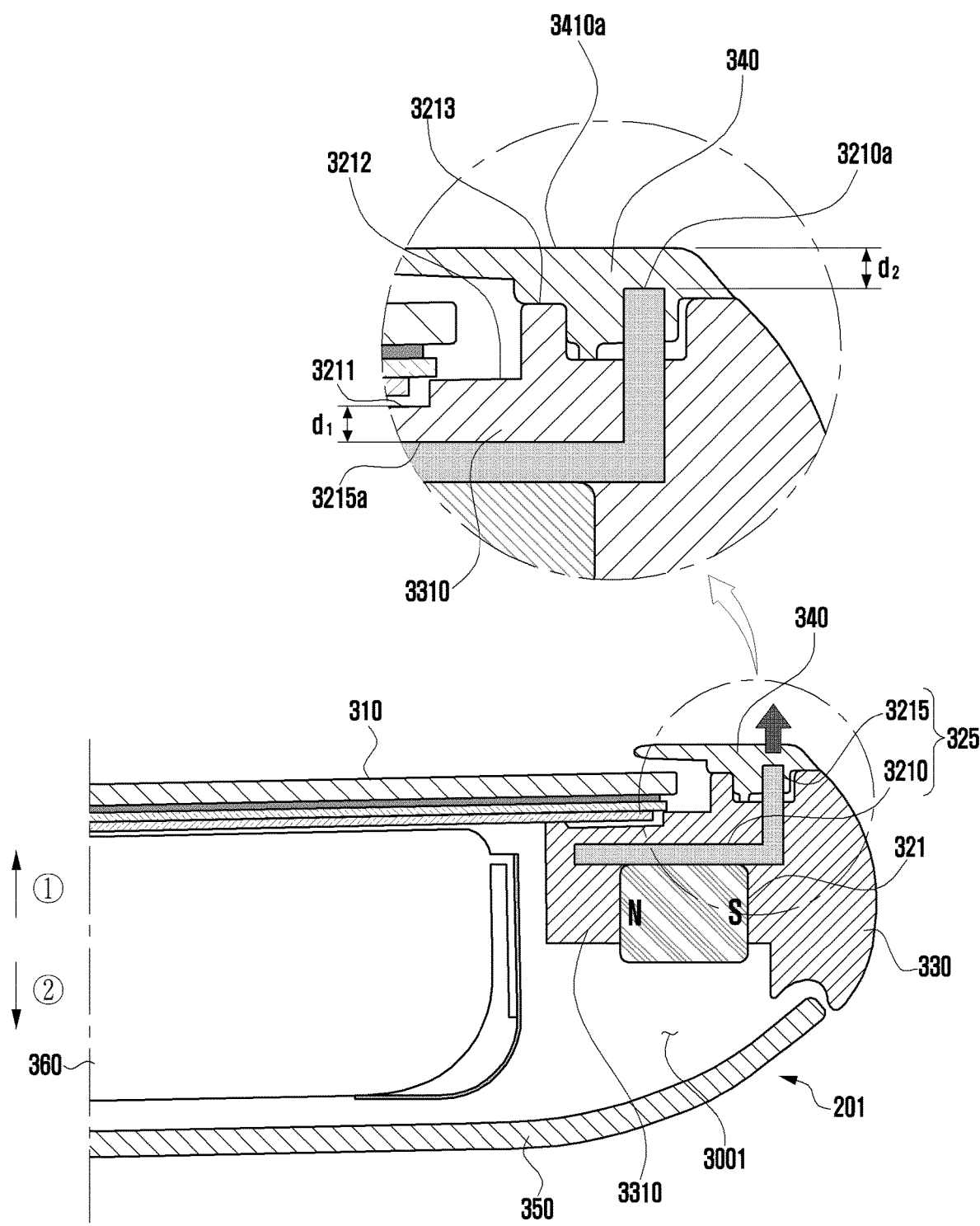
FIG. 3B illustrates a cross-sectional view taken along A-A' in the electronic device shown in FIG. 3A according to an embodiment.

FIG. 3B is a cross-sectional view taken along A-A' in the electronic device shown in FIG. 3A according to an embodiment. In FIG. 3B, elements which are substantially the same as those of the electronic device 101 of FIG. 3A are denoted by the same reference numerals, and detailed descriptions thereof may be omitted.

Referring to 3B, according to an embodiment, the housing 210 (e.g., the housing 210 of FIG. 2) of the electronic device 101 may include the display 310 disposed on the front surface, a rear plate 350 disposed in a direction opposite to the display 310, and the side member 330 surrounding a space between the edge of the display 310 and the edge of the rear plate 350.

According to an embodiment, the side member 330 may include the magnetic structure 320 and a support member 3310 at least partially extending from the side member 330 to an inner space 3001 of a housing 301 or structurally coupled to the side member.

The side member 330 and the support member 3310 may be formed of, for example, a non-metal (e.g., a polymer) material. For example, the side member 330 and the support member 3310 may be formed through an injection molding manner by using a mold and an injection molding machine.

According to an embodiment, the side member 330 may include the protection frame 340 extending from the side member 330 in a first direction (direction ①) or coupled thereto to protect the edge of the display 310. For example, the protection frame 340 and the side member 330 may be disposed through at least one coupling manner among bonding, taping, fusion, or structural coupling. As an example, in FIG. 3A, the side member 330 and the protection frame 340 as separate members are coupled to each other. However, the protection frame 340 may be integrally formed with and extend from the side member 330.

According to an embodiment, the protection frame 340 may be configured as at least a portion of the side member 330, and may be implemented in a form which does not overlap with the display 310.

The display 310 may be disposed to be supported through the support member 3310 of the side member 330. According to an embodiment, at least a portion of the edge of the display 310 may be disposed in a space between the support member 3310 and the protection frame 340. Accordingly, at least a portion of the edge of the display 310 may be disposed so as not to be visible from the outside of the electronic device 101. The display 310 may be formed to maintain a separation interval from the protection frame 340 through the side member 330 and the support member 3310, thereby preventing damage to the outer surface of the display 310.

The display 310 may include a first surface (an upper surface) facing in a first direction (direction ①) and a second surface (a lower surface) facing in a second direction (direction ②) opposite to the first surface. According to an embodiment, the display 310 may include a flexible display. The display 310 may include, for example, at least one of a window layer, a polarizing layer sequentially disposed on the rear surface of the window layer, a display panel, a polymer member, and a metal sheet layer. A display structure may be changed according to the type of a display attached to the electronic device 101, and a detailed description thereof will be omitted since it corresponds to a known art.

A battery 360 may be disposed in the inner space between the second surface of the display 310 and the rear plate 350, but other elements of the electronic device 101 may be disposed. The battery 360 may be an element for supplying power to at least one element of the electronic device 101. The battery 360 may be integrally disposed inside the electronic device 101 or may be disposed detachably from the electronic device 101.

The rear plate 350 may be configured as a rear cover, but may also be configured as a rear display. The rear plate 350 may be formed of, for example, coated or colored glass, a ceramic, a polymer, a metal (e.g., aluminum, stainless steel (STS), or magnesium), or of a combination of at least two of the above materials. According to an embodiment, the rear plate 350 may include a flat part and a curved part extending from the flat part to be bent in the first direction (direction ①). According to various embodiments, the curved part may be implemented by deforming into a flat shape. At least a portion of the curved part may be disposed through at least one coupling manner among bonding, taping, fusion, or structural coupling with the side member 330.

According to an embodiment, the magnetic structure 320 may be at least partially fixed to the side member 330. When the electronic device 101 is viewed from the front (the second direction (direction ②)), the magnetic structure 320 may be disposed in an area where at least a portion of the edge of the display 310 overlaps, and may be fixed in the direction of the inner wall of the side member 330. The magnetic structure 320 may be disposed to be invisible from the outside due to the side member 330 and/or the protection frame 340.

According to an embodiment, the magnetic structure 320 may be fixed to a portion of the side member 330 and the protection frame 340, and partially fixed to a combination thereof.

According to an embodiment, the magnetic structure 320 may include the magnetic force generating source 321 and the magnetic force output guide 325.

According to an embodiment, the magnetic force generating source 321 may have an S-pole and an N-pole disposed such that a magnetic field is formed in a horizontal area parallel to the display 310. As an example, the S-pole may be disposed in the direction of the outer wall of the side member 330, and the N-pole may be disposed in the direction of the inner wall of the side member 330. The positions of the S-pole and the N-pole may be changed. The magnetic force emitted from the N-pole may converge in the S-pole direction to form a magnetic field.

According to an embodiment, the magnetic force output guide 325 may be attached in the first direction (direction ①) of the magnetic force generating source 321 to increase an attractive force with an external magnetic body. The magnetic force output guide 325 may be magnetized with the magnetic force generated from the magnetic force generating source 321 to cause a magnetic field in a larger area than the magnetic force generating source 321 to be formed. In the magnetic field of the magnetic force generating source 321, the magnetic field in the first direction (direction ①) may be larger than the magnetic field in the second direction (direction ②) due to the magnetic force output guide 325 disposed in the first direction (direction ①).

According to an embodiment, the magnetic output guide 325 may include a first guide 3210 disposed in a horizontal direction with the magnetic force generating source 321, and a second guide 3215 extending from the first guide and disposed in the first direction (direction ①).

The first guide 3210 may be disposed to have a length longer than a length of the magnetic force generating source 321. The first guide 3210 may be disposed between the magnetic force generating source 321 and the second surface (the lower surface) of the display 310. The second guide 3215 may extend vertically to the first guide 3210, and may be disposed in a direction of an upper surface of the side member 330 or an upper surface of the protection frame 340 (e.g., the first direction (direction ①)) near the edge of the display 310. According to an embodiment, the second guide 3215 may be disposed such that the length of the second guide 3215 extends to the space of the protection frame. As an example, the second guide 3215 may be disposed at a coupling position of the protection frame 340 and the side member 330.

One end of the first guide 3210 which does not extend from the second guide 3215 may be magnetized with a polarity positioned in the direction of the inner wall of the side member 330, for example, the N-pole, so as to have an N-pole property. An end extending from the second guide 3215 in the first direction (direction ①) may be magnetized with a polarity positioned in the direction of the outer wall of the side member 330, for example, the S-pole, so as to have an S-pole property.

According to an embodiment, the support member 3310 may be implemented to have a structure for mounting a display. For example, an upper surface 3211 of the support member may include a first protrusion part 3212 and a second protrusion part 3213, and the second protrusion 3213 may include a recess for coupling with the protection frame 340, but the structural coupling of FIG. 3B is only an example and is not limited thereto.

A first separation distance d1 between an upper surface 3210a of the first guide 3210 and the upper surface 3211 of the support member may be determined as a minimum distance at which the magnetic structure 320 can be seated on the support member 3310 and the side member 330. For example, the first separation distance d1 may be implemented to be about 0.6 mm, but is not limited thereto. According to an embodiment, the first separation distance d1 may be determined according to a second separation distance d2 between an upper surface 3410a of the protection frame 340 (or the side member 330) and an end 3215a of the second guide 3215, and the length of the second guide 3215. The second separation distance d2 may be determined such that the second guide 3215 is received in the space of the protection frame (or the side member) and a gap with an external magnetic body is minimized. For example, the second separation distance d2 may be implemented to be about 0.6 mm, but is not limited thereto. The second guide 3215 may extend up to a minimum distance from the upper surface 3410a of the protection frame 340 (or the side member 330) and thus the second guide is close to the external magnetic body, so that the attractive force may be increased.

According to an embodiment, in the first direction (direction ①) of the magnetic force generating source 321, a magnetic field area is expanded due to the magnetic force output guide 325 to induce an increase in the attractive force, and in the second direction (direction ①) of the magnetic force generating source 321, the magnetic field area is limited to the size of the magnetic force generating source 321. Therefore, the influence of a magnetic force on other elements mounted inside the housing of the electronic device 101 can be minimized, and a space for mounting other electronic components inside the housing can be secured.

Figure 4:
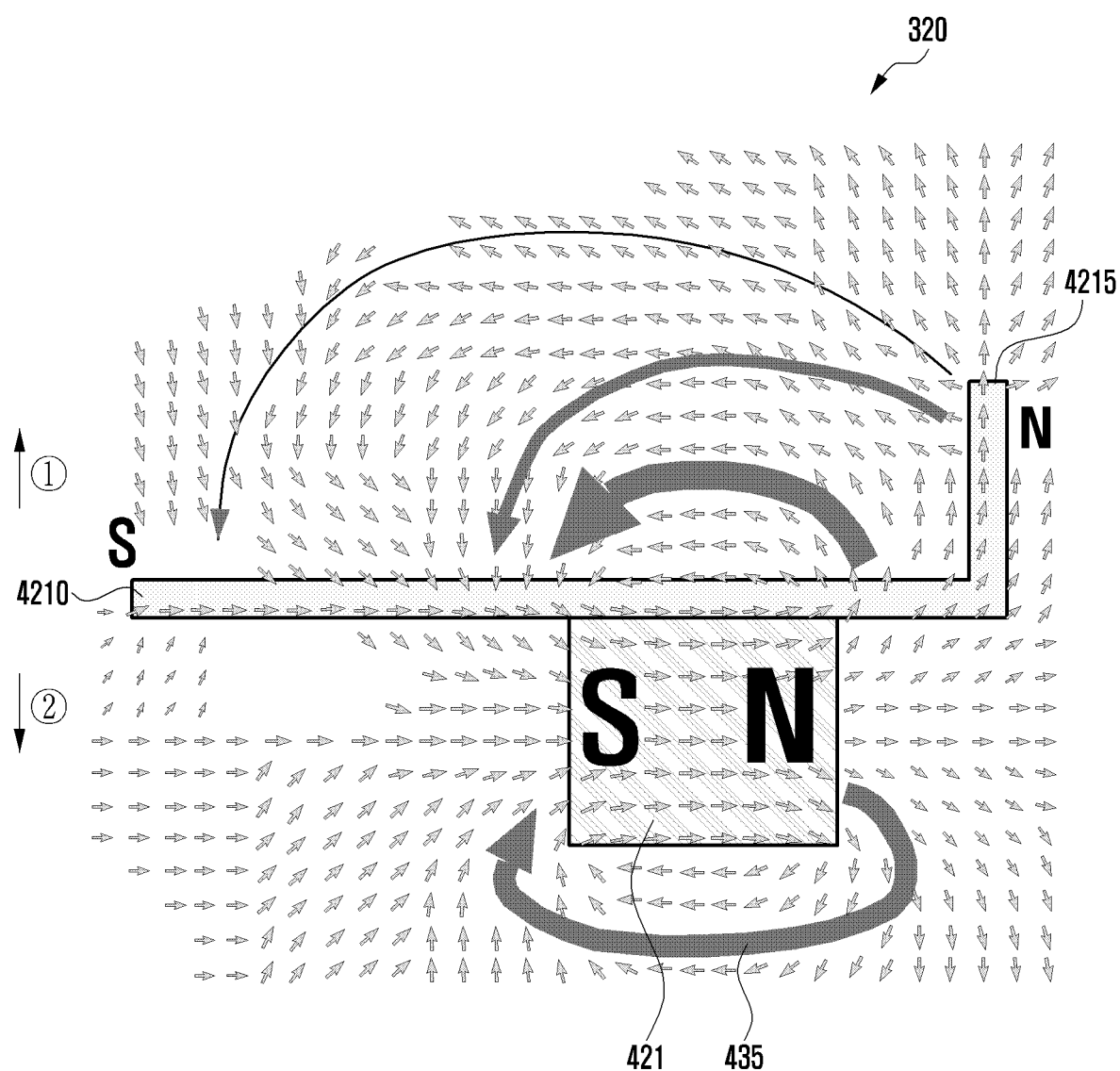
FIG. 4 illustrates a magnetic field state of a magnetic structure included in an electronic device according to an embodiment.

FIG. 4 illustrates a magnetic field state of a magnetic structure included in an electronic device according to an embodiment.

Referring to FIG. 4, according to an embodiment, in a magnetic structure (e.g., the magnetic structure 320 of FIGS. 3A/3B) fixed to a side member (e.g., the side member 330 of FIG. 3) of the electronic device 101, a magnetic field area may be expanded by a magnetic force generating source 421 (e.g., the magnetic force generating source 321 of FIGS. 3A/3B) and a magnetic force output guide 425 (e.g., the magnetic force output guide 325 of FIGS. 3A/3B). The magnetic output guide 425 may include a first guide 4210 disposed in a horizontal direction with the magnetic force generating source 421, and a second guide 4215 extending from the first guide 4210 and disposed in a first direction (direction ①). Since an end of the first guide 4210 is positioned closer to an S-pole than an N-pole, the end may be magnetized to have the S-pole, and since an end of the second guide 4215 is positioned closer to the N-pole than to the S-pole, the end may be magnetized to have the N-pole. The magnetic force emitted from the N-pole may converge in the direction of the S-pole.

According to an embodiment, the magnetic structure 320 may have a relatively larger magnetic field area in the first direction (direction ①) than that in a second direction (direction ②) of the magnetic force generating source 421 due to the magnetic force output guide 425. For example, in the magnetic field area in the second direction (direction ②) of the magnetic force generating source 421, a magnetic field may be formed in an area corresponding to the size of the magnetic force generating source 421, as in reference numeral 435. On the other hand, in the magnetic field area in the first direction (direction ①) of the magnetic force generating source 421, the magnetic force emitted from the second guide 4215 may converge in the first guide 4210 since the first guide 4210 is magnetized to have the S-pole and the second guide 4215 is magnetized to have the N-pole. While the magnetic force in the first direction (direction ①) of the magnetic force generating source 421 is formed to have an area larger than the magnetic field area of the magnetic force generating source 421 by the first and second guides 4210 and 4215, the magnetic force in the second direction (direction ②) of the magnetic force generating source 421 may be limited to have the magnetic field area of the magnetic force generating source.

Figure 5:
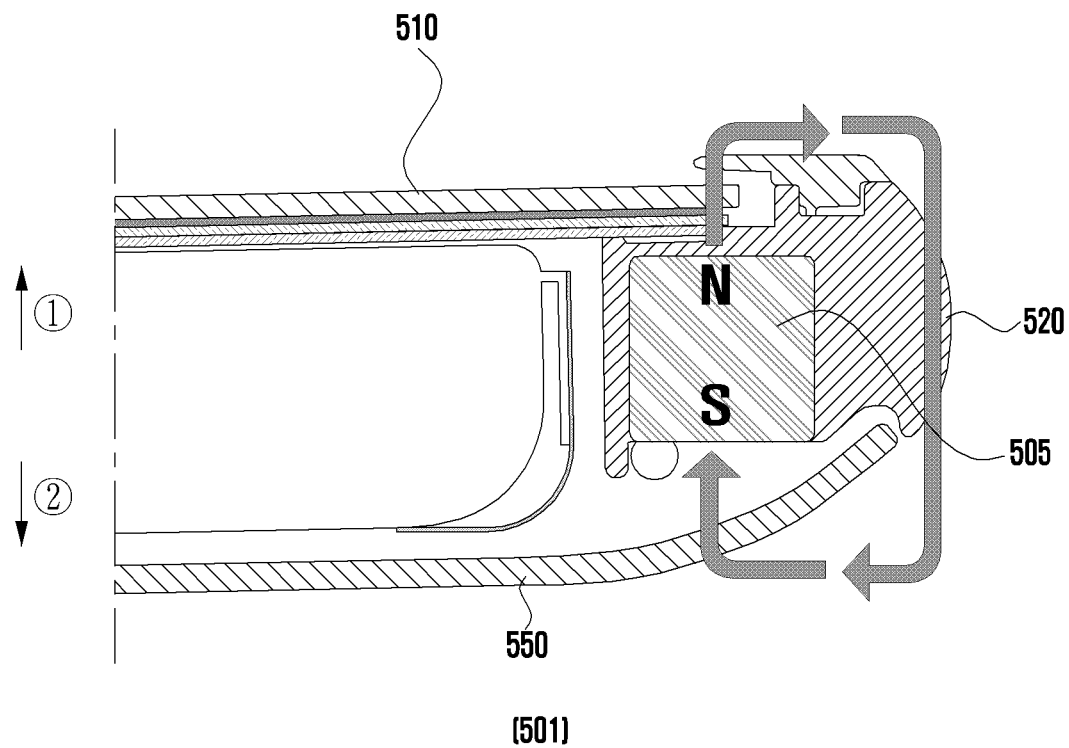
FIG. 5 illustrates a view showing a comparison between magnetic fields according to an arrangement structure of a magnet according to an embodiment.
Figure 5:
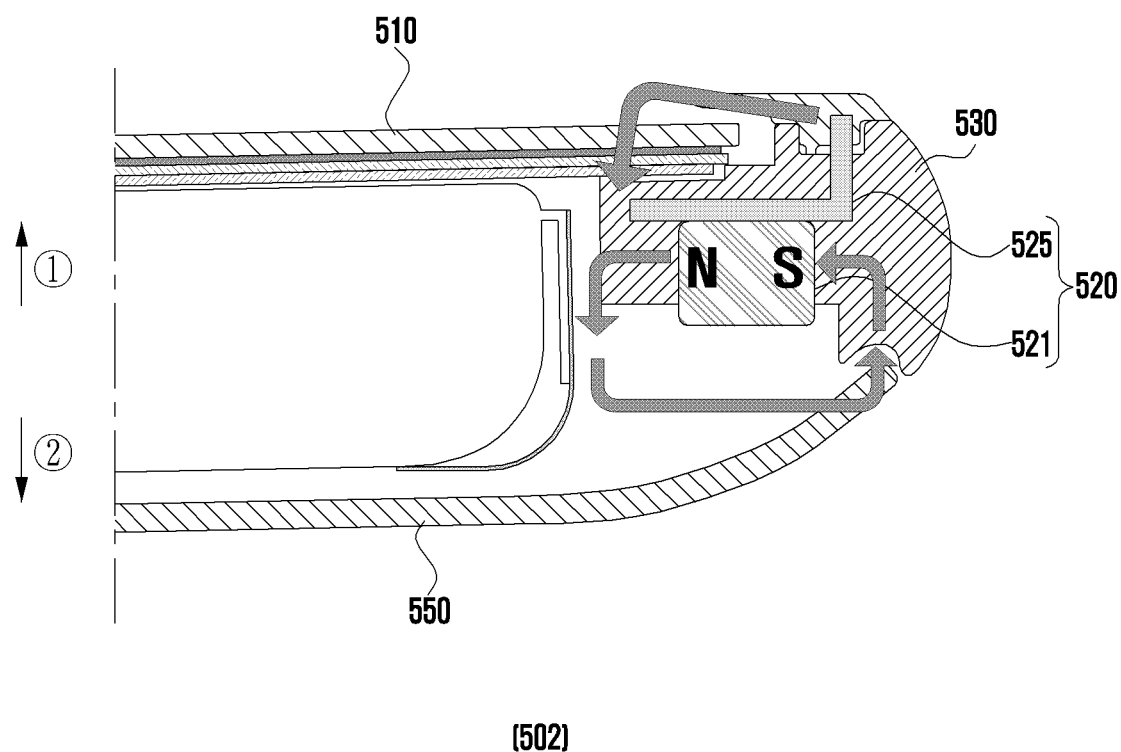

FIG. 5 is a view showing a comparison between magnetic fields according to an arrangement structure of a magnet according to an embodiment.

In FIG. 5, reference numeral 501 indicates an electronic device in which a magnet or a magnetic body is disposed and to which a comparative embodiment is applied, and reference numeral 502 indicates an electronic device in which a magnetic structure including a magnetic force output guide is disposed according to the disclosure.

Referring to FIG. 5, according to an embodiment, the electronic device 101 may use a cover of the electronic device or may use a magnet to maintain the folding of a foldable electronic device. The electronic device 101 may include a magnet disposed in a side member 530 disposed in a space between a display 510 and a rear plate 550, and the magnitude of the magnetic force of the magnet may increase as areas of the opposite polarities of the magnet increase.

In consideration of reference numeral 501 to which the comparative embodiment is applied, a magnetic body 505 is disposed in the side member 530 adjacent to the edge of the display 510 such that a magnetic field area is formed in a vertical direction of the display 510. In this case, the magnetic body 505 is disposed to have a size which can secure a magnetic force of a predetermined size or more in order to maintain (or secure) an attractive force with an external magnetic body, and as a magnetic field area widens due to the size of a magnet, it may affect an electronic component mounted in the inner space of the electronic device. In addition, according to the comparative embodiment, since the magnetic body 505 and electronic components (e.g., a camera module and an antenna) affected by the magnetic body 505 are separated by a predetermined distance, a space in which an electronic component or an element of the electronic device can be mounted is reduced.

On the other hand, according to various embodiments, as shown in reference numeral 502, the electronic device may include a magnetic structure 520 including a magnetic force generating source (a magnet) 521 and a magnetic force output guide 525 in the side member 530 disposed in a space between the display 510 and the rear plate 550. For example, the electronic device may secure the size of a magnetic field only in a first direction (direction ①) of the magnetic force generating source 521 and reduce the size of the magnetic force generating source disposed in a second direction (direction ②), so as to not only secure an inner space in which an electronic component or an element can be mounted in the second direction (direction ②), but also maintain (or secure) an attractive force with an external magnetic body in the first direction (direction ①).

Hereinafter, when the electronic device is a foldable electronic device including a flexible display, an arrangement structure of the magnetic structure will be described.

Figure 6:
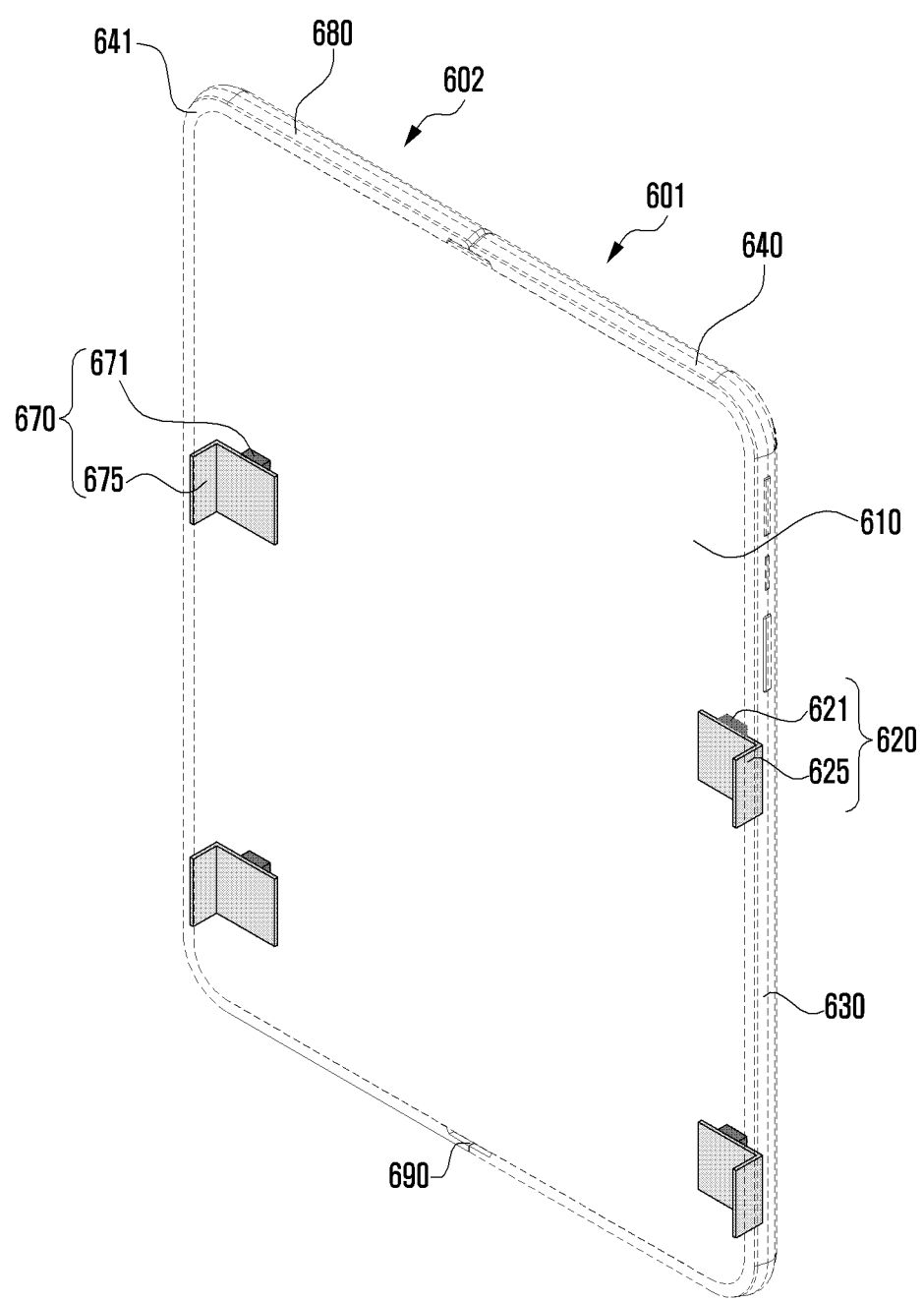
FIG. 6 illustrates a configuration of an electronic device including a magnetic structure according to an embodiment.

FIG. 6 illustrates a configuration of an electronic device including a magnetic structure according to an embodiment.

Referring to FIG. 6, according to an embodiment, an electronic device (e.g., the electronic device 101 of FIG. 1) may include a foldable electronic device 600 including a first housing 601 and a second housing 602. The first housing 601 may include at least one first magnetic structure 620, and the second housing 602 may include at least one second magnetic structure 670 which is symmetrical to the first magnetic structure 620. According to an embodiment, the foldable electronic device 600 may include at least a portion or the entire of the configuration of FIG. 1, but it will be omitted in FIG. 6 for convenience of description. FIG. 6 illustrates a structure in which the first housing 601 and the second housing 602 are in-folded, but the configurations of the disclosure may be applied to an out-folding structure.

According to an embodiment, the first housing 601 may include a first surface (a front surface) 611, a second surface (a rear surface) 612 disposed in a direction opposite to the first surface 611, and a first side member 630 surrounding a first space between the first surface 611 and the second surface 612. The second housing 602 may include a second side member 680 surrounding a second space between a third surface (a front surface) 613 facing the same direction as the first surface 611 and a fourth surface (a rear surface) 614 facing the same direction as the second surface 612. The first housing 601 and the second housing 602 may be disposed on both sides around a folding axis, and have a shape which is generally symmetric with respect to the folding axis. FIG. 6 illustrates the front side of the foldable electronic device, while omitting illustration of the rear side of the foldable electronic device.

According to an embodiment, the first housing 601 and the second housing 602 may be installed rotatably with respect to each other through a hinge module 690 (or a hinge structure). For example, the foldable electronic device 600 may maintain a folded or unfolded state by rotating the first housing 601 and the second housing 602 with respect to each other through the hinge module 690. According to an embodiment, in the foldable electronic device 600, the first surface 611 and the third surface 613 may face each other in a folded state, and the first surface 611 and the third surface 613 may face in the same direction in an unfolded state.

According to an embodiment, the foldable electronic device 600 may include a flexible display 610 disposed to at least partially cross the first surface 611 of the first housing 601 and the third surface 613 of the second housing 602. According to an embodiment, the flexible display 610 may be disposed to be supported by at least some areas of the first housing 601, the hinge module 690, and the second housing 602. According to another embodiment, the foldable electronic device 600 may form a sub-display on at least one of the second surface 612 and the fourth surface 614.

According to an embodiment, the first housing 601 may partially include at least one first magnetic structure 620 on the first side member 630 of the edge of the flexible display 610. The second housing 602 may partially include at least one second magnetic structure 670 on the second side member 680 of the edge of the flexible display 610. As an example, FIG. 6 illustrates that two first magnetic structures 620 spaced apart by a predetermined interval and two second magnetic structures 670 spaced apart by a predetermined interval are arranged, but the disclosure is not limited thereto, and the arrangement and number of magnetic structures may be changed according to the structure and type of the electronic device.

The first magnetic structure 620 and the second magnetic structure 670 may be disposed in a shape symmetrical with respect to each other. For example, when the first magnetic structure 620 has the shape shown in FIGS. 3A and 3B, the second magnetic structure 670 may have a structure symmetrical to the first magnetic structure 620. The first magnetic structure 620 and the second magnetic structure 670 may be disposed at positions facing each other in a folded state (e.g., a folding or infolding state) in which the first surface 611 and the third surface 613 face each other.

According to an embodiment, the first magnetic structure 620 and the second magnetic structure 670 may be formed to have a structure in which a magnetic field area is expanded in a front direction (e.g., the first surface 611 and the third surface 613) in which the flexible display 610 is disposed and a magnetic field area is reduced in a rear direction (e.g., the second surface 612 and the fourth surface 614). For example, the first magnetic structure 620 may include a first magnetic force generating source 621 and a first magnetic force output guide 625, and the second magnetic structure 670 may include a second magnetic force generating source 671 and a second magnetic force output guide 675. The length of the first magnetic force output guide 625 may be longer than the length of the first magnetic force generating source 621, and the length of the second magnetic force output guide 675 may be longer than the length of the second magnetic force generating source 671.

According to an embodiment, the first magnetic structure 620 may be fixed to at least a portion of the first side member 630, and the second magnetic structure 670 may be fixed to at least a portion of the second side member 680. At least a portion of the first magnetic force output guide 625 may protrude from the first side member 630 to the direction of the first surface 611 (e.g., a first protection frame 640) of the first housing 601. At least a portion of the second magnetic force output guide 675 may protrude from the second side member 680 to the direction of the third surface 613 (e.g., a second protection frame 641) of the second housing 602.

In the first magnetic structure 620 and the second magnetic structure 670, in a folded state (e.g., a folding or infolding state) in which the first surface 611 and the third surface 613 face each other, a portion of the first magnetic force output guide 625 and a portion of the second magnetic force output guide 675 which are adjacent to each other at positions facing each other may be arranged to be magnetized to have different polarities. Accordingly, in the folded state in which the first surface 611 and the third surface 613 face each other, the foldable electronic device 600 may maintain the folded state due to the attractive force between the first magnetic structure 620 and the second magnetic structure 670.

According to an embodiment, a portion of the first magnetic force output guide 625 and a portion of the second magnetic force output guide 675 may be disposed to be adjacent to each other with a minimum distance therebetween in the folded state (e.g., a folding or infolding state) in which the first surface 611 and the third surface 613 face each other. For example, the first magnetic structure 620 and the second magnetic structure 670 may be disposed based on the first separation distance d1 and the second separation distance d2 described in FIG. 3B.

According to an embodiment, the foldable electronic device 600 may include at least one protection frame 640 and 641 (e.g., a decorative member or a decor) disposed in an upper portion of the flexible display 610. For example, the first housing 601 may include the first protection frame 640 which extends from and is integrally formed with the first side member 630, or is structurally coupled to the first side member 630, and the second housing 602 may include the second protection frame 641 which extends from and is integrally formed with the second side member 680 or is structurally coupled to the second side member 680. When the foldable electronic device 600 includes the protection frames 640 and 641, the first magnetic structure 620 may be fixed to at least a portion of each of the first side member 630 and the first protection frame 640, and the second magnetic structure 670 may be fixed to at least a portion of each of the second side member 680 and the second protection frame 641.

Figure 7:
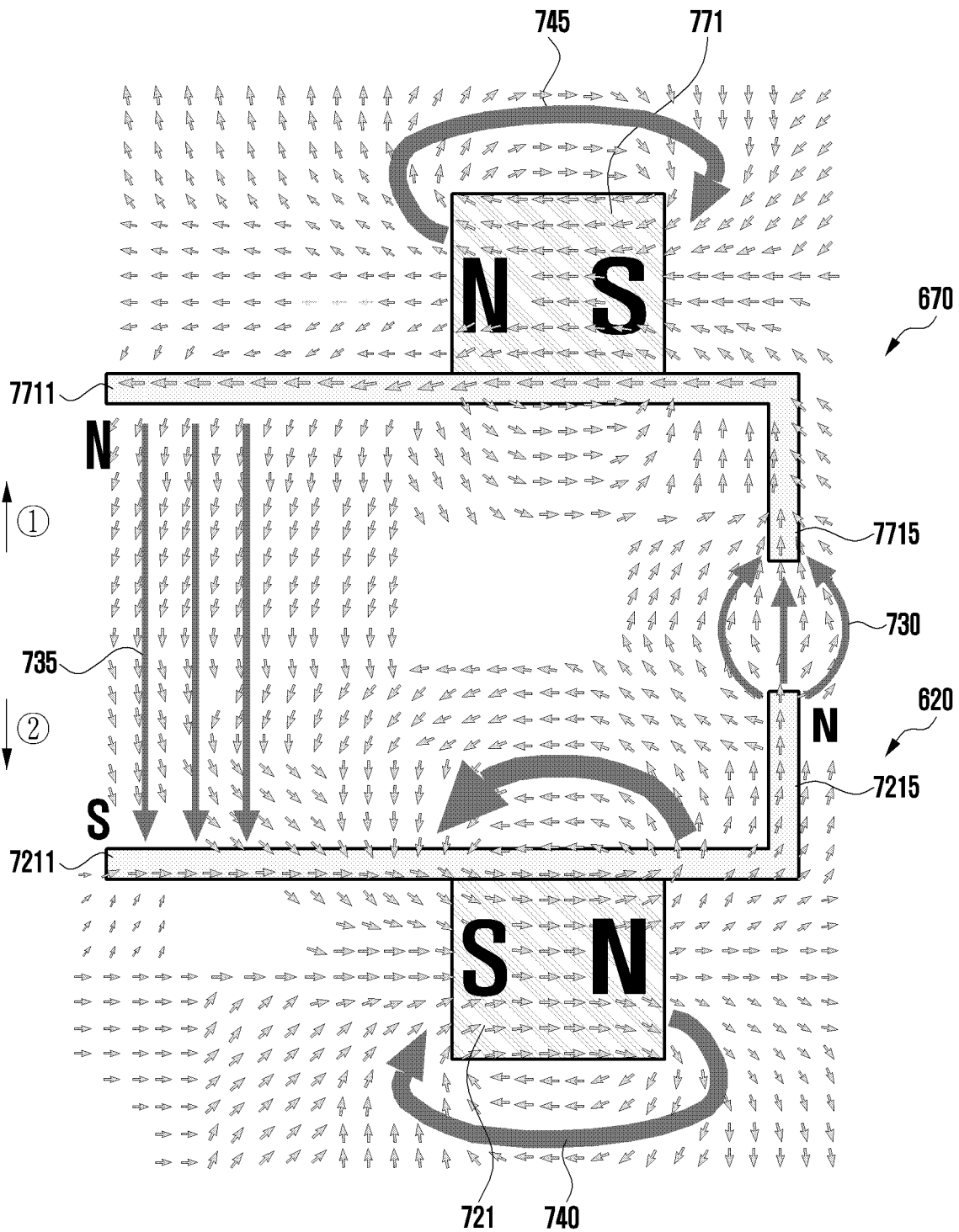
FIG. 7 illustrates a magnetic field state of a magnetic structure included in an electronic device according to an embodiment.

FIG. 7 illustrates a magnetic field state of a magnetic structure included in an electronic device according to an embodiment.

Although omitted in FIG. 7, the arrangement structure of the first magnetic structure 620 and the second magnetic structure 670 is substantially the same as that in FIG. 6, and other configurations of the electronic device may be omitted.

Referring to FIG. 7, according to an embodiment, in relation to a foldable electronic device (e.g., the foldable electronic device 600 of FIG. 6), in a folded state (e.g., a folding or infolding state) in which the first surface 611 of the first housing 601 and the third surface 613 of the second housing 602 face each other, in the first magnetic structure 620 and the second magnetic structure 670, a magnetic field area in a first direction (direction ①) (e.g., the front direction) in which the first surface 611 and the third surface 613 are disposed may be formed greater rather than a magnetic field area in a second direction (direction ②) (e.g., the rear direction) in which the second surface 612 and the fourth surface 614 are disposed.

According to an embodiment, a first magnetic force output guide 725 may include a first guide 7211 disposed in a horizontal direction with a first magnetic force generating source 721, and a second guide 7215 extending from the first guide 7211 and disposed in a direction of an upper surface of a display (e.g., the first direction (direction ①)). The first guide 7211 may be disposed to have a length longer than that of the first magnetic force generating source 721. A second magnetic force output guide 775 may include a third guide 7711 disposed in a horizontal direction with a second magnetic force generating source 771, and a fourth guide 7715 extending from the third guide 7711 and disposed in the direction of the upper surface of the display (e.g., the second direction (direction ②)). The third guide 7711 may be disposed to have a length longer than that of the second magnetic force generating source 771.

The first guide 7211 and the third guide 7711 may be magnetized to have opposite polarities, and the second guide 7215 and the fourth guide 7715 may be magnetized to have opposite polarities. For example, since one end of the first guide 7211 is positioned closer to an S-pole than an N-pole, the end may be magnetized to have the S-pole, and since one end of the second guide 7215 is positioned closer to the N-pole than the S-pole, the end may be magnetized to have the N-pole. On the contrary, since one end of the third guide 7711 is positioned closer to an N-pole than an S-pole, the end may be magnetized to have the N-pole, and since one end of the fourth guide 7715 is positioned closer to the S-pole than the N-pole, the end may be magnetized to have the S-pole.

In the case of the folded state (e.g., a folding or infolding state) in which the first surface 611 of the first housing 601 and the third surface 613 of the second housing 602 face each other, the fourth guide 7715 magnetized to have the S-pole is adjacent in a state where the second guide 7215 is magnetized to have the N-pole, and thus the magnetic force in the first direction (direction ①) may converge in a direction from the second guide 7215 to the fourth guide 7715, as in a direction 730. On the contrary, the first guide 7211 magnetized to have the S-pole is adjacent in a state where the third guide 7711 is magnetized to have the N-pole, and thus the magnetic force may converge in a direction from the third guide 7711 to the first guide 7211, as in a direction 735. On the other hand, the magnetic force in the second direction (direction ②) may converge as in the directions 740 and 745.

Since the first magnetic force output guide 725 and the second magnetic force output guide 775 induce an increase in an attractive force by expanding a magnetic field area in the first direction (direction ①) of the magnetic force generating sources 721 and 771, and limit the magnetic field area to the size of the opposite generating sources 721 and 771 in the second direction (direction ②) of the magnetic force generating sources, the influence of the magnetic force on other elements mounted inside the housings of the foldable electronic device 600 can be minimized. Accordingly, according to the reduction of a mounting space for a magnetic structure, a mounting space for other elements of the foldable electronic device can be secured.

Figure 8:
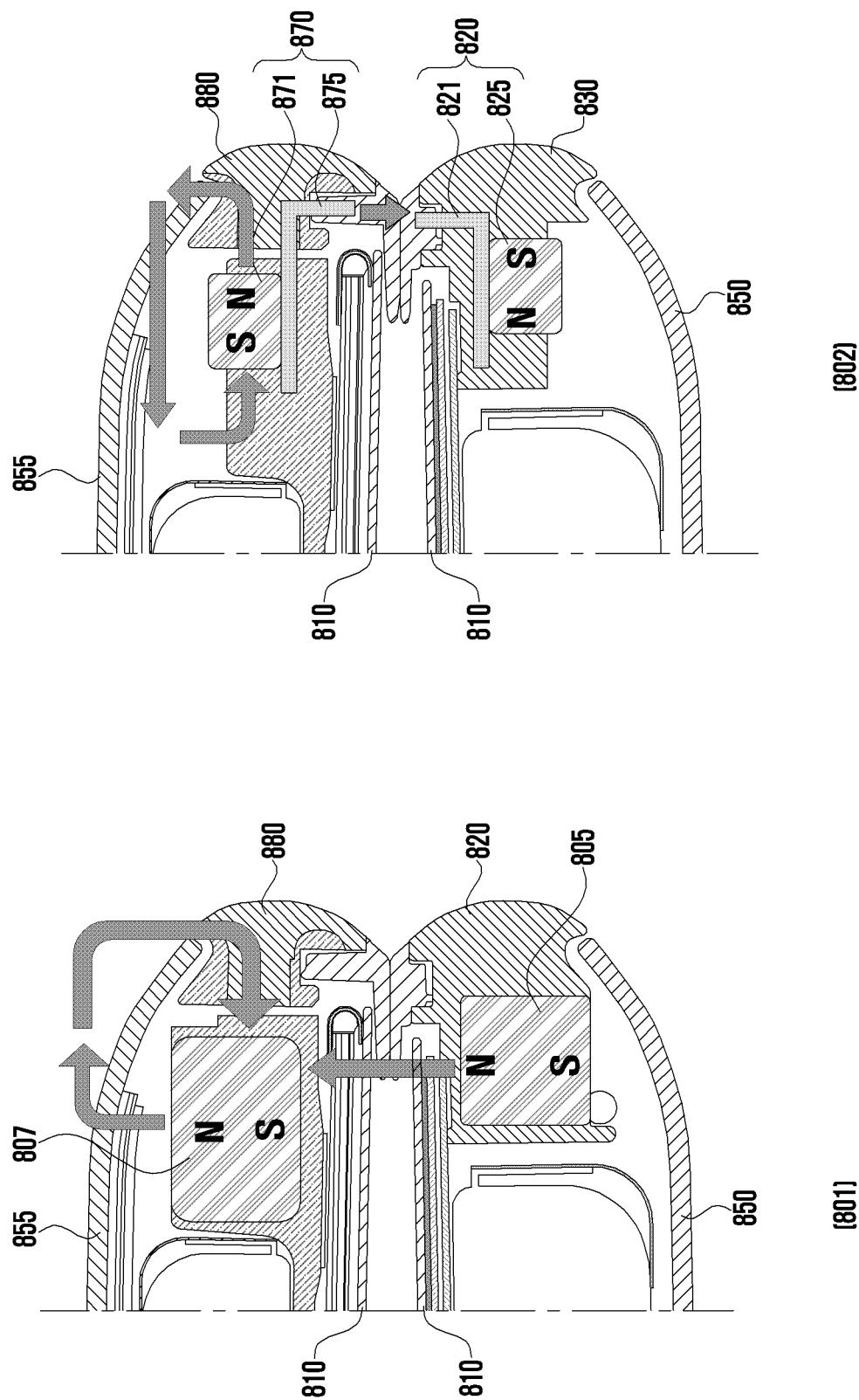
FIG. 8 illustrates a view showing a comparison between magnetic fields according to an arrangement structure of a magnet according to an embodiment.

FIG. 8 is a view showing a comparison between magnetic fields according to an arrangement structure of a magnet according to an embodiment.

In FIG. 8, reference numeral 801 indicates a foldable electronic device in which a magnet or a magnetic body is disposed and to which a comparative embodiment is applied, and reference numeral 802 indicates a foldable electronic device in which a magnetic structure including a magnetic force output guide is disposed according to the disclosure.

Referring to FIG. 8, in consideration of reference numeral 801 to which the comparative embodiment is applied in a foldable electronic device, in order to maintain a folded state (or a folding state), in a side member 830 or 880, a first magnetic body 805 may be disposed such that the magnetic field area is formed in a vertical direction of a flexible display 810, and a second magnetic body 807 may be disposed in a second housing. In this case, it can be seen that, since the first magnetic body 805 and the second magnetic body 807 are arranged in a size which can secure a magnetic force of a predetermined size or more, the first magnetic body 805 and the second magnetic body 807 substantially occupy ⅔ or more of an inner space of each housing. When a first housing and the second housing are in a folded state, according to the comparative embodiment, since the magnetic force emitted from an N-pole converges on an S-pole, a magnetic field corresponding to the size of a magnetic body is formed not only in the direction of the display 810 in which the first housing and the second housing face each other, but also in the directions of rear plates 850 and 855. Therefore, magnetic field interference with internal elements and lack of mounting space may occur. As an example, as shown in reference numeral 801, when arrangement positions of the magnetic bodies 805 and 807 are not the same, a range of a magnetic field area may be larger, and a space for mounting an electronic component or an element of an electronic device that affects a magnetic force becomes narrow, or when an electronic component or an element that affects a magnetic force is placed near the magnetic bodies, a shielding structure for shielding may be required.

On the other hand, as shown in reference numeral 802, in the foldable electronic device according to various embodiments, magnetic structures 820 and 870 are arranged in the first housing and the second housing, wherein the length of a magnetic force output guide 825 or 875 is longer than that of a magnetic force generating source 821 or 871, so that, even when the size of a magnet is reduced, the magnitude of a magnetic force may be increased in the direction of the display 810 of the first housing and the second housing and a magnetic field range may be reduced in the directions of the rear plates 850 and 855 of the first housing and the second housing. Accordingly, a mounting space inside the first housing or the second housing can be secured while the size of the magnet is reduced and an attractive force for maintaining a folding state of the first housing and the second housing is maintained.

Figure 9:
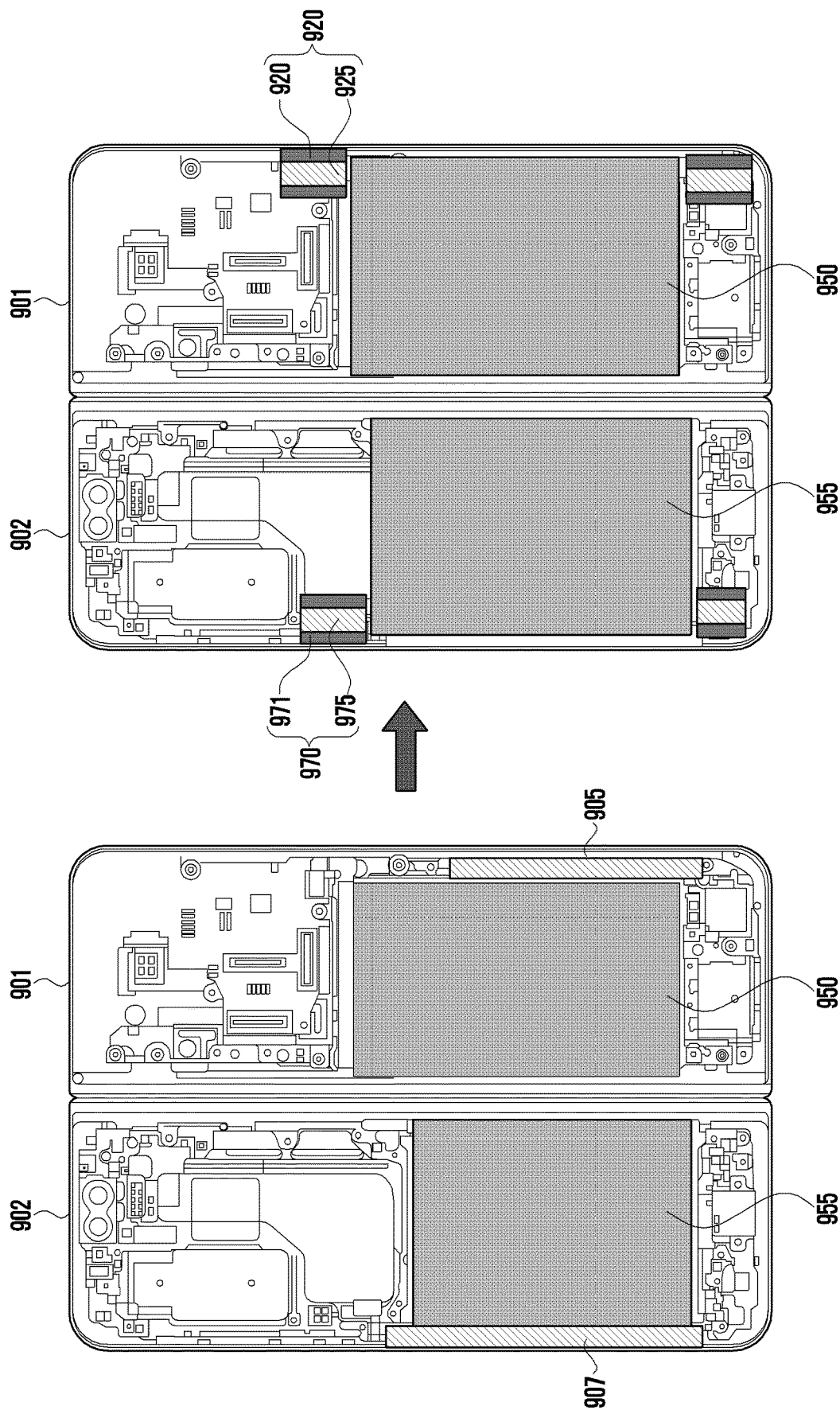
FIG. 9 illustrates a view showing a comparison between electronic devices including magnetic structures according to an embodiment.

FIG. 9 is a view showing a comparison between electronic devices including magnetic structures according to an embodiment.

Referring to FIG. 9, according to various embodiments, an electronic device can further secure a mounting space for mounting an electronic component or an element mounted inside the electronic device by arranging a magnetic structure 920 in which the length of a magnetic force output guide 925 is longer than that of a magnetic force generating source 921.

According to a comparative embodiment, a first magnetic body 905 having a line shape may be disposed on one side of a first housing 901, and a second magnetic body 907 having a line shape may be disposed on one side of a second housing 902. It can be seen that the first magnetic body 905 and the second magnetic body 907 are disposed to have a predetermined length along the edges of batteries 950 and 955 since the folding is required to be maintained in a folded state in which the first housing 901 and the second housing 902 face each other.

On the other hand, a foldable electronic device according to various embodiments may increase a magnetic force (e.g., attractive force) due to magnetic force output guides 925 and 975, and thus the sizes of magnetic force generating sources 921 and 971 may be reduced. Accordingly, a plurality of magnetic structures 920 and 970 may be disposed in the first housing 901 and the first housing 902 even in an extra space or a narrow space other than an area where other elements are disposed. In the foldable electronic device, since a plurality of magnetic structures may be disposed, a magnetic structure having a line shape is not required as in the comparative embodiment, and thus a mounting space can be secured and a space for receiving the batteries 950 and 955 can be expanded.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a display;
a rear plate disposed in a direction opposite to the display;
a side member surrounding a space between the display and the rear plate and comprising a support member configured to support the display; and
at least one magnetic structure included in at least a portion of the side member,
wherein the at least one magnetic structure comprises a magnetic force generating source disposed in a direction of the rear plate and a magnetic force output guide contacted with the magnetic force generating source, and at least a portion of the magnetic force output guide extends in a direction of the display,
wherein the magnetic force output guide comprises a first guide disposed in a horizontal direction with the magnetic force generating source and a second guide extending from an end of the first guide and formed in a vertical direction to the first guide, and
wherein the first guide is magnetized to have a first pole of the magnetic force generating source, and the second guide is magnetized to have a second pole of the magnetic force generating source.

2. The electronic device of claim 1, wherein:
one pole of the first pole and the second pole is disposed in a direction of an outer wall of the side member and another pole is disposed in a direction of an inner wall of the side member so as to form a magnetic field in a horizontal area to be parallel to the display.

3. The electronic device of claim 2, wherein a length of the magnetic force output guide is longer than a length of the magnetic force generating source.

4. The electronic device of claim 1, wherein the magnetic structure and the magnetic force output guide are coupled through at least one of bonding, taping, and structural coupling.

5. The electronic device of claim 1, wherein the magnetic force output guide comprises at least one of a material to be magnetized with the magnetic force generating source, pure iron, a steel use stainless (SUS) 430 material, a stainless steel (STS) material, and a steel plate cold commercial (SPCC) material.

6. The electronic device of claim 1, further comprising a protection frame extending from and integrally formed with the side member or structurally coupled to the side member, the protection frame configured to protect an edge of the display,
wherein the at least one magnetic structure is fixed to at least a portion of each of the protection frame and the side member at a coupling position of the protection frame and the side member.

7. The electronic device of claim 1, wherein the at least one magnetic structure has a structure in which a magnetic field area in a direction of the rear plate is formed relatively smaller than a magnetic field area in the direction of the display.

8. An electronic device comprising:
a first housing comprising a first surface, a second surface facing in a direction opposite to the first surface, and a first side member disposed between the first surface and the second surface;
a second housing comprising a third surface facing the same direction as the first surface, a fourth surface facing the same direction as the second surface, and a second side member disposed between the third surface and the fourth surface;
a display disposed in at least a portion of each of the first surface and the third surface;
at least one first magnetic structure included in at least a portion of the first side member; and
at least one second magnetic structure included in at least a portion of the second side member and disposed to be symmetrical to the at least one first magnetic structure at a position opposite to the at least one first magnetic structure in a state in which the first housing and the second housing are folded,
wherein the at least one first magnetic structure comprises a first magnetic force generating source disposed in a direction of the second surface and a first magnetic force output guide disposed in a direction of the first surface, and at least a portion of the first magnetic force output guide comprises a structure formed in the direction of the first surface, and
wherein the at least one second magnetic structure comprises a second magnetic force generating source disposed in a direction of the fourth surface and a second magnetic force output guide disposed in a direction of the third surface, and at least a portion of the second magnetic force output guide comprises a structure formed in the direction of the third surface.

9. The electronic device of claim 8, wherein:
in the first magnetic force generating source, one pole is disposed in a direction of an outer wall of the first side member and another pole is disposed in a direction of an inner wall of the first side member so as to form a magnetic field in a horizontal area to be parallel to the display, and
a polarity of the second magnetic force generating source is disposed opposite to a position of a polarity of the first magnetic force generating source.

10. The electronic device of claim 8, wherein a length of the first or the second magnetic force output guide is longer than a length of the first or the second magnetic force generating source.

11. The electronic device of claim 10, wherein:
the first magnetic force output guide comprises a first guide disposed in a horizontal direction with the first magnetic force generating source and a second guide extending from the first guide and formed in the direction of the first surface, and
the second magnetic force output guide comprises a third guide disposed in a horizontal direction with the second magnetic force generating source and a fourth guide extending from the second guide and formed in the direction of the third surface.

12. The electronic device of claim 11, wherein when the first guide is magnetized to have a first pole, the second guide is disposed to be magnetized to have a second pole, the third guide is disposed to be magnetized to have the second pole, and the fourth guide is disposed to be magnetized to have the first pole.

13. The electronic device of claim 11, wherein:
the second guide is fixed in a direction of an upper surface of the first side member,
the third guide is fixed in a direction of an upper surface of the second side member, and
when the first housing and the second housing are in a folded state, a separation distance between the second guide and the fourth guide satisfies a configured distance.

14. The electronic device of claim 8, wherein, when the display is viewed from above, the at least one first magnetic structure and the at least one second magnetic structure are disposed at a position overlapping with at least a portion of an edge area of the display.

15. The electronic device of claim 8, wherein:
the first side member or the second side member comprises a support member or a support structure extending from or structurally coupled to the first side member or the second side member, and
the support member is configured to support the display.

16. The electronic device of claim 8, further comprising:
a first protection frame extending from or structurally coupled to the first side member and configured to protect an edge of the display disposed on the first surface; and
a second protection frame extending from or structurally coupled to the second side member and configured to protect an edge of the display disposed on the third surface,
wherein the first magnetic structure is disposed to be fixed to at least a portion of each of the first protection frame and the first side member, and the second magnetic structure is disposed to be fixed to at least a portion of each of the second protection frame and the second side member.

17. The electronic device of claim 16, wherein:
at least a portion of the at least one first magnetic structure is disposed to extend up to the first protection frame, and
at least a portion of the at least one second magnetic structure is disposed to extend up to the second protection frame.

18. The electronic device of claim 8, further comprising a hinge module configured to be foldable with reference to a rotation axis between the first housing and the second housing.

* * * * *